(12) United States Patent
Kang et al.

(10) Patent No.: US 6,180,443 B1
(45) Date of Patent: *Jan. 30, 2001

(54) SEMICONDUCTOR DEVICE AND METHOD OF FABRICATING THE SAME

(75) Inventors: Dae Gwan Kang; Chang Yong Kang, both of Chungcheongbuk-do (KR)

(73) Assignee: LG Semicon Co., Ltd., Chungcheongbuk-Do (KR)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/156,777

(22) Filed: Sep. 18, 1998

(30) Foreign Application Priority Data

May 4, 1998 (KR) ................................. 98-15954

(51) Int. Cl.[7] .............................................. H01L 21/8238
(52) U.S. Cl. ...................... 438/217; 438/289; 438/305; 438/526; 438/275
(58) Field of Search ................... 438/275, 305, 438/289, 290, 291, 217, 526, 696, 787, 791

(56) References Cited

U.S. PATENT DOCUMENTS

| | | | |
|---|---|---|---|
| 5,019,520 | * 5/1991 | Komori et al. | 437/26 |
| 5,219,777 | * 6/1993 | Kang | 437/45 |
| 5,413,949 | * 5/1995 | Hong | 437/46 |
| 5,429,956 | * 7/1995 | Shell et al. | 437/29 |
| 5,472,897 | * 12/1995 | Hsu et al. | 437/44 |
| 5,518,943 | * 5/1996 | Tsunoda | 437/43 |
| 5,543,647 | * 8/1996 | Kobayashi et al. | 257/345 |
| 5,658,811 | * 8/1997 | Kimura et al. | 438/289 |
| 5,688,700 | * 11/1997 | Kao et al. | 437/29 |
| 5,736,440 | * 4/1998 | Manning | 438/232 |
| 5,747,368 | * 5/1998 | Yang et al. | 438/217 |
| 5,766,990 | * 6/1998 | Tseng | 438/291 |
| 5,811,339 | * 9/1998 | Tseng | 438/289 |
| 5,894,158 | * 4/1999 | Wei | 257/408 |
| 5,963,798 | * 10/1999 | Kim et al. | 438/199 |

FOREIGN PATENT DOCUMENTS

362054466 * 3/1987 (JP).

OTHER PUBLICATIONS

Mutoh, S. et al., "1–V Power Supply High–Speed Digital Circuit Technology with Multithreshold–Voltage CMOS", *IEEE Journal of Solid State Circuits*, vol. 30, No. 8, pp. 847–854, Aug. 1995.

Kuroda, T. et al., "A 0.9V 150MHz 10mW 4mm$^2$ 2–D Discrete Cosine Transform Core Processor with Variable–Threshold–Voltage Scheme", *1996 Digest of Technical Papers*, vol. 39, pp. 166–167 and 437, Feb. 1996.

* cited by examiner

Primary Examiner—Long Pham
(74) Attorney, Agent, or Firm—Morgan, Lewis & Bockius LLP

(57) ABSTRACT

A semiconductor device having a plurality of transistors connected in series in a semiconductor substrate, the device includes first and second gate electrodes on the semiconductor substrate, a punch-through stop layer in the semiconductor substrate below the first gate electrode at a predetermined depth, and first, second, and third heavily doped impurity regions in the semiconductor substrate at both sides of the first and second gate electrodes.

19 Claims, 11 Drawing Sheets

US 6,180,443 B1

SEMICONDUCTOR DEVICE AND METHOD OF FABRICATING THE SAME

This application claims the benefit of Korean Application No. 98-15954 filed May 4, 1998, which is hereby incorporated by reference.

BACKGROUND OF THE INVENTION

1. Field of the Invention

The present invention relates to a semiconductor device, and more particularly, to a semiconductor and a method of fabricating the same. Although the present invention is suitable for a wide scope of application, it is particularly suitable for improving a performance of the semiconductor device and for reducing a power consumption.

2. Discussion of the Related Art

The background art will be explained with reference to FIG. 1 illustrating a logic circuit diagram of a two-input NAND gate. As shown in FIG. 1, a NAND gate includes first and second PMOS transistors 1 and 2 connected in parallel and first and second NMOS transistors 3 and 4 connected in series.

Source terminals of the PMOS transistors 1 and 2 are in common connected to a power source voltage terminal Vdd. First and second input signals are applied to respective gate electrodes. A drain terminal of the PMOS transistors 1 and 2 is used as a common output terminal of the first and second PMOS transistors 1 and 2. The common drain terminal of the first and second PMOS transistors 1 and 2 connected with a drain terminal of the first NMOS transistor 3. The first input signal is applied to a gate electrode of the first NMOS transistor 3. A source terminal of the first NMOS transistor 3 is connected with a drain terminal of the second NMOS transistor 4. The second input signal is applied to a gate electrode of the second NMOS transistor 4. A source terminal of the second NMOS transistor 4 is connected with a ground voltage terminal Vss.

In the aforementioned NAND gate, a probability for outputting an value of 1" by combining the first and second input signals is three-fourth whereas a probability is one-fourth for outputting an value of 0". Therefore, if both the first and second input signals are 1", the output value is 0". If not, the output value is 1".

In addition, since the first and second NMOS transistors 3 and 4 are connected in series, a pull-down path resistance is increased. Consequently, to keep the pull-down path resistance the same, a size of the NMOS transistor should be the same as that of the PMOS transistor.

FIG. 2 is a logic circuit diagram illustrating a background art two-input NOR gate. As shown in FIG. 2, a NOR gate includes first and second PMOS transistors 5 and 6 connected in series and first and second NMOS transistors 7 and 8 connected in parallel.

A source terminal of the first PMOS transistor 5 is connected to a power source voltage terminal Vdd. A first input signal is applied to a gate electrode of the first PMOS transistor 5. A source terminal of the second PMOS transistor 6 is connected to a drain terminal of the first PMOS transistor 5. A second input signal is applied to a gate electrode of the second PMOS transistor 6. A drain terminal of the PMOS transistor 6 is used as an output terminal. Drain terminals of the first and second NMOS transistors 7 and 8 are in common connected to the drain terminal of the second PMOS transistor 6. The first and second input signals are applied to respective gate electrodes of the first and second NMOS transistors 7 and 8. Their source terminals are connected to a ground voltage terminal Vss.

In the aforementioned NOR gate, a pull-up path is formed by a serial connection between the first and second PMOS transistors 5 and 6 whereas a pull-down path is formed by a parallel connection between the first and second NMOS transistors 7 and 8. A probability for outputting an value "1" by combining the first and second input signals is one-fourth while a probability is three-fourths for outputting "0". Therefore, if both the first and second input signals are "0", an output value is "1". If one of the input signals is "1", an output value is "0".

Meanwhile, since a serial connection between the first and second PMOS transistors 5 and 6 increases a pull-up path resistance, a symmetric switching may be executed only if a size of the PMOS transistor is four times greater than that of the NMOS transistor.

A background art semiconductor device and a method of fabricating the same will be described with reference to the accompanying drawings.

FIG. 3 is a cross-sectional view illustrating two NMOS transistors according to the background art, connected in series in the logic circuit of the NAND gate of FIG. 1.

As shown in FIG. 3, NMOS transistors include a field oxide film (not shown) formed in a field region of a semiconductor substrate 11 where the field region and an active region are defined, first and second gate electrodes 13a and 13b formed in a predetermined region on the active region at a predetermined interval by forming gate insulating films between the semiconductor substrate 11 and the first and second gate electrodes 13a and 13b, insulating film sidewalls 16a formed at both sides of the first and second gate electrodes 13a and 13b, and first, second and third heavily doped n-type impurity regions 17a, 17b, and 17c each having an lightly doped drain (LDD) region formed in the surface of the semiconductor substrate 11 at both sides of the first and second gate electrodes 13a and 13b.

FIGS. 4A to 4E are cross-sectional views illustrating the process steps of fabricating method of two NMOS transistors connected in series in the logic circuit of the NAND gate of FIG. 1.

As shown in FIG. 4A, a field oxide film (not shown) is formed at a field region of a semiconductor substrate 11 where the field region and an active region are formed. A gate insulating film 12 and a polysilicon layer 13 for a gate electrode are sequentially formed on the active region of the semiconductor substrate 11. Subsequently, a photoresist 14 is coated on the polysilicon layer 13 and then selectively patterned by exposure and developing processes.

As shown in FIG. 4B, the polysilicon layer 13 and the gate insulating film 12 are selectively removed using the patterned photoresist 14 as a mask to form first and second gate electrodes 13a and 13b.

Referring to FIG. 4C, the photoresist 14 is removed from the first and second gate electrodes. Then, n-type impurities is implanted into the entire surface of the semiconductor to form a LDD region 15 in the semiconductor substrate 11 at both sides of the first and second gate electrodes 13a and 13b using the first and second gate electrodes 13a and 13b as masks.

As shown in FIG. 4D, an insulating film 16 is formed on the entire surface of the semiconductor substrate 11 including the first and second gate electrodes 13a and 13b.

In FIG. 4E, the insulating film 16 is etched back to form insulating film sidewalls 16a at both sides of the first and second gate electrodes 13a and 13b. Subsequently, n-type impurities are implanted into the entire surface of the semiconductor substrate 11 using the first and second gate electrodes 13a and 13b and the insulating film sidewalls 16a as masks in order to form first, second and third heavily doped n-type impurity regions 7a, 17b and 17c. The first, second and third heavily doped n-type impurity regions 17a, 17b, and 17c are connected to the LDD region 15.

A process steps of fabricating method of two PMOS transistors connected in series in the logic circuit of the NOR gate of FIG. 2 are identical to the above process steps except that a p-type impurity implantation process is performed instead of a n-type impurity ion implantation process.

The background art semiconductor device and the method of fabricating the same have several problems as follows.

Since two transistors connected in series have the same structure, a leakage current in turn-off state increases when a low power operation, thereby increasing a power consumption.

In addition, when a threshold voltage is increased to prevent a power consumption, a driving current is reduced in operating state, thereby reducing an operation speed of the transistor.

Further, it is impossible to eliminate a leakage current in off state by applying a voltage to the substrate at a low threshold voltage since the substrate has a low doping concentration.

SUMMARY OF THE INVENTION

Accordingly, the present invention is directed to a semiconductor device and a method of fabricating the same that substantially obviate one or more of the problems due to limitations and disadvantages of the related art.

An object of the present invention is to provide a semiconductor device and a method of fabricating the same, in which a device performance is improved and a power consumption is reduced during a low voltage operation by varying a threshold voltage depending on an applying voltage of the substrate of transistors connected in series.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device having a plurality of transistors connected in series in a semiconductor substrate, according to the present invention includes first and second gate electrodes formed in a certain region on the semiconductor substrate at a certain interval by interleaving gate insulating films between the semiconductor substrate and the first and second gate electrodes, a punch-through stop layer formed in the semiconductor substrate below the first gate electrode at a predetermined depth, and first, second and third heavily doped impurity ion regions formed in a surface of the semiconductor substrate at both sides of the first and second gate electrodes.

In another aspect, a semiconductor device having a plurality of transistors connected in series in a semiconductor substrate, the device includes first and second gate electrodes on the semiconductor substrate, a punch-through stop layer in the semiconductor substrate below the first gate electrode at a predetermined depth, and first, second, and third heavily doped impurity regions in the semiconductor substrate at both sides of the first and second gate electrodes.

In another aspect, a method of fabricating a semiconductor device having a plurality of transistors connected in series in a semiconductor substrate, according to the present invention includes the steps of forming a punch-through stop layer having a predetermined width in the semiconductor substrate, forming first and second gate electrodes having a certain interval to dispose one of the first and second gate electrodes over the punch-through stop layer by interleaving a gate insulating film on the semiconductor substrate, and forming first, second and third heavily doped impurity ion regions in a surface of the semiconductor substrate at both sides of the first and second gate electrodes.

In a further aspect, a method of fabricating a semiconductor device having a plurality of transistors connected in series in a semiconductor substrate, the method comprising the steps of forming a punch-through stop layer having a predetermined width in the semiconductor substrate, forming first and second gate electrodes on the semiconductor, one of the first and second gate electrodes being over the punch-through stop layer, and forming first, second, and third heavily doped impurity regions in the semiconductor substrate at both sides of the first and second gate electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
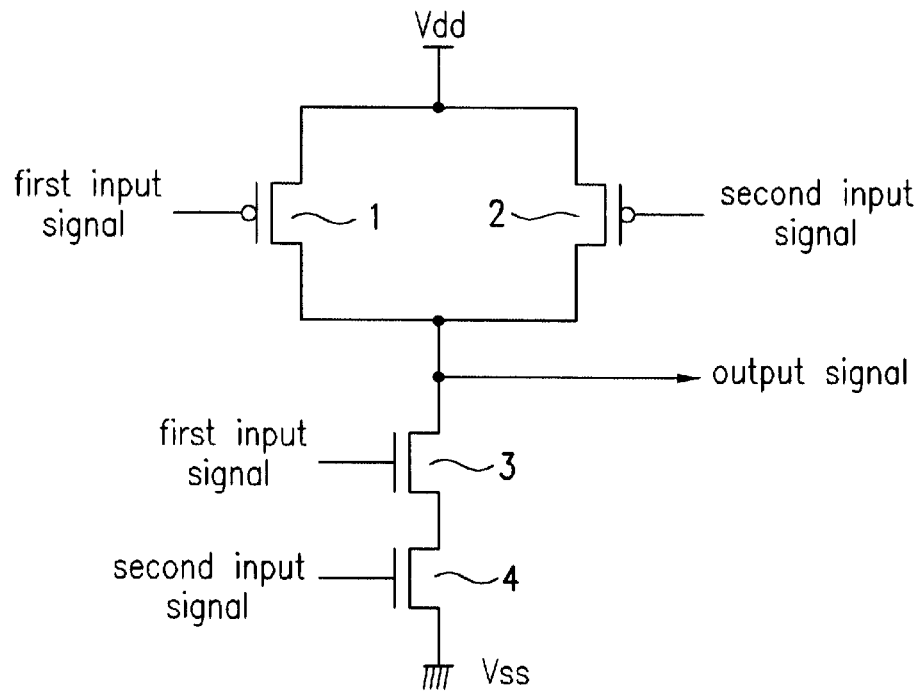
FIG. 1 is a logic circuit diagram illustrating a background art two-input NAND gate.
Figure 2:
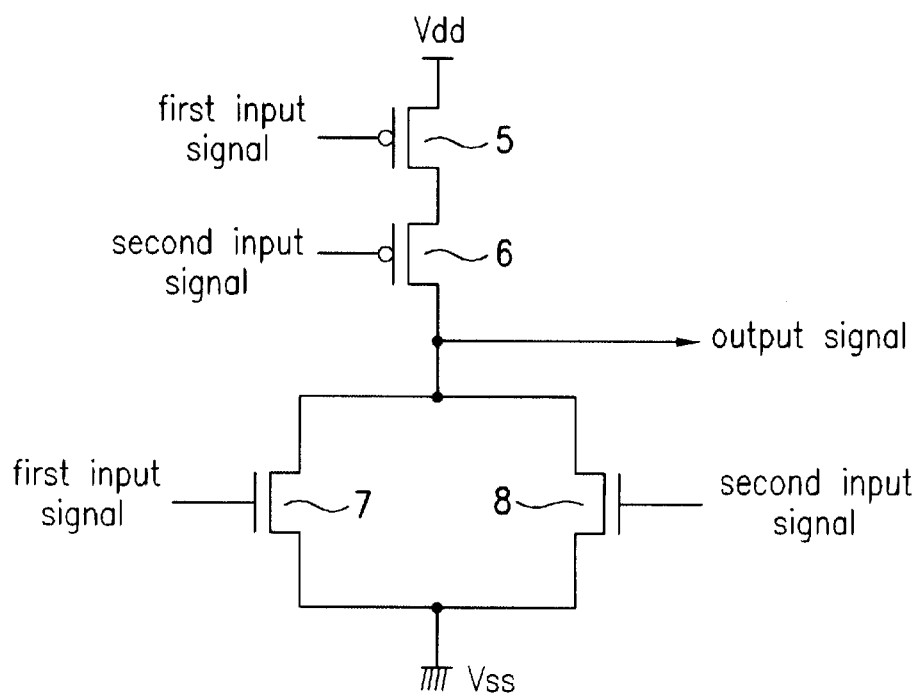
FIG. 2 is a logic circuit diagram illustrating a background art two-input NOR gate.
Figure 3:
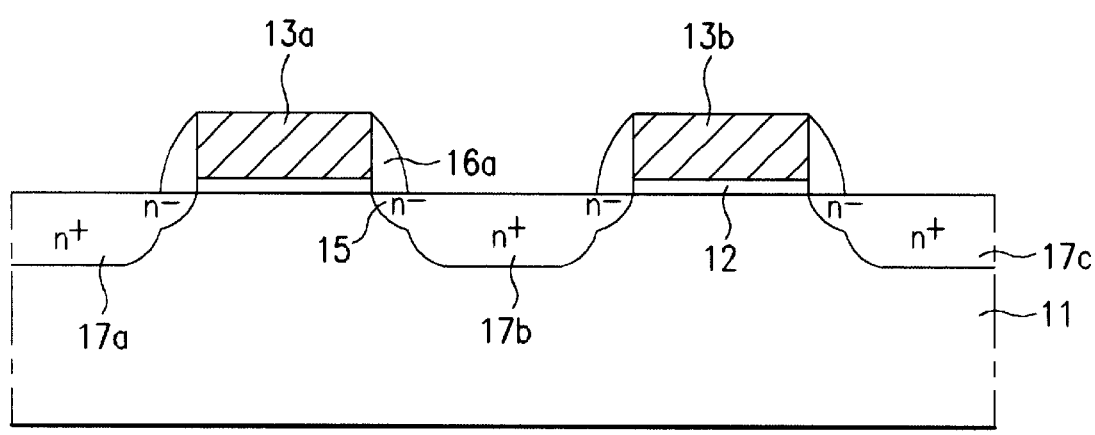
FIG. 3 is a cross-sectional view illustrating two NMOS transistors according to the background art, connected in series in the logic circuit of the NAND gate of FIG. 1.
Figure 4A:
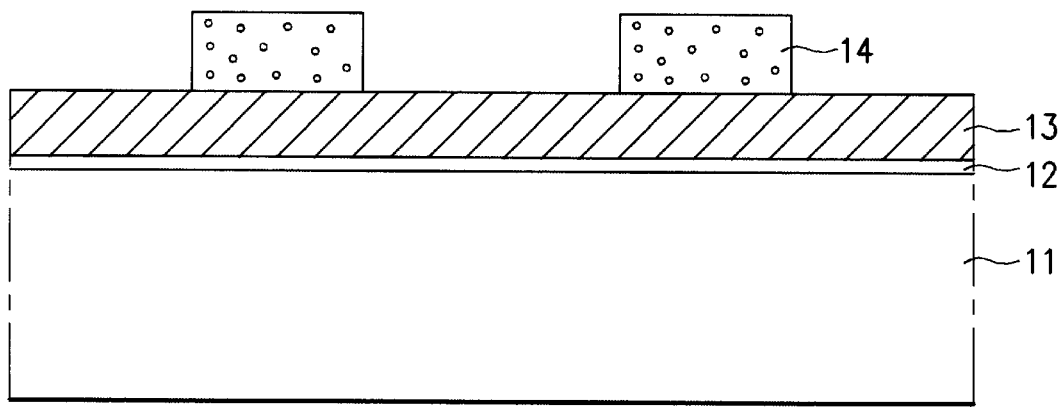
FIGS. 4A to 4E are cross-sectional views illustrating process steps of fabrication method of two NMOS transistors according to the background art, connected in series in the logic circuit of the NAND gate of FIG. 1.
Figure 4B:
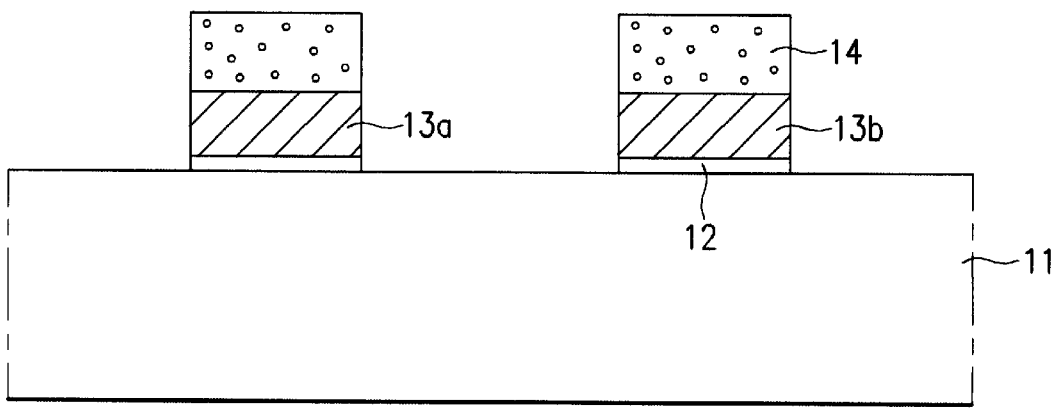
Figure 4C:
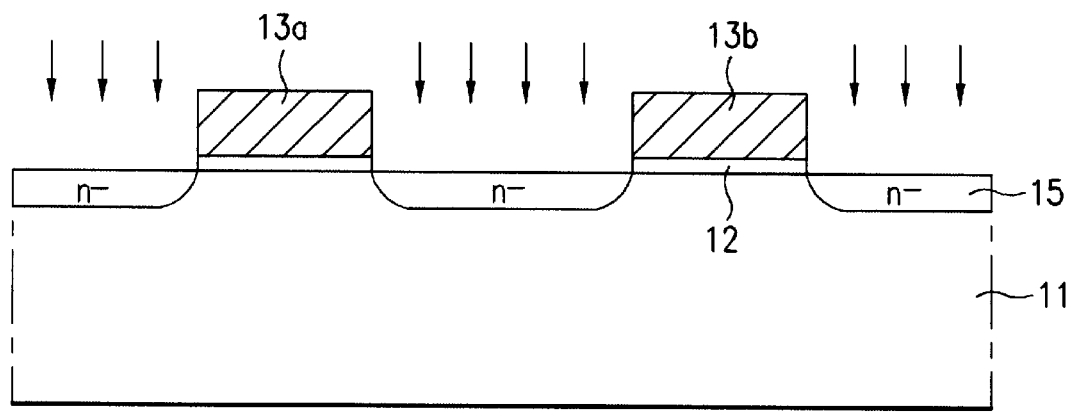
Figure 4D:
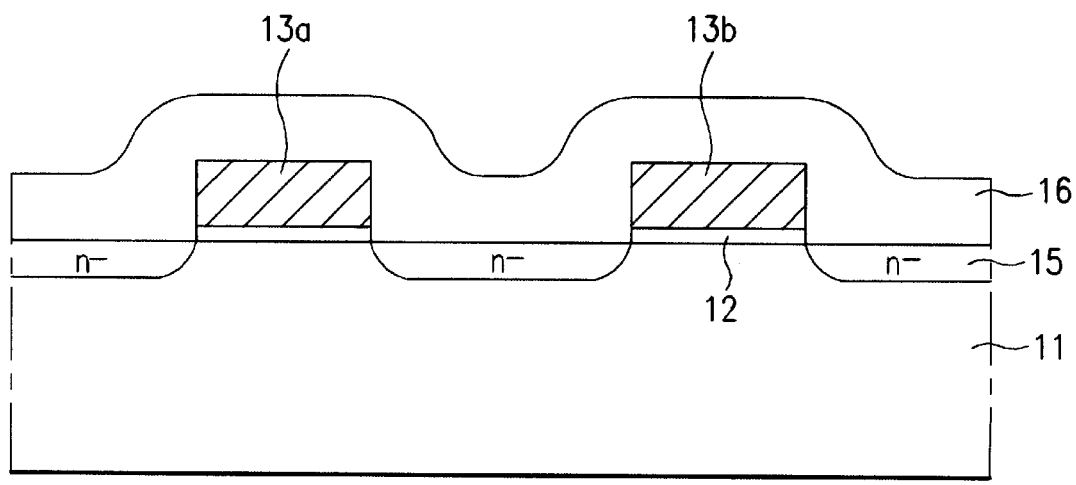
Figure 4E:
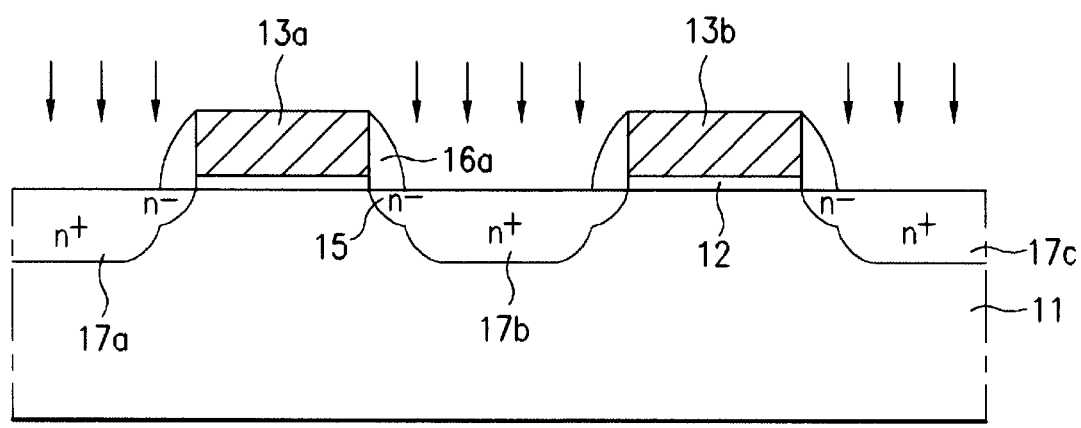
Figure 5:
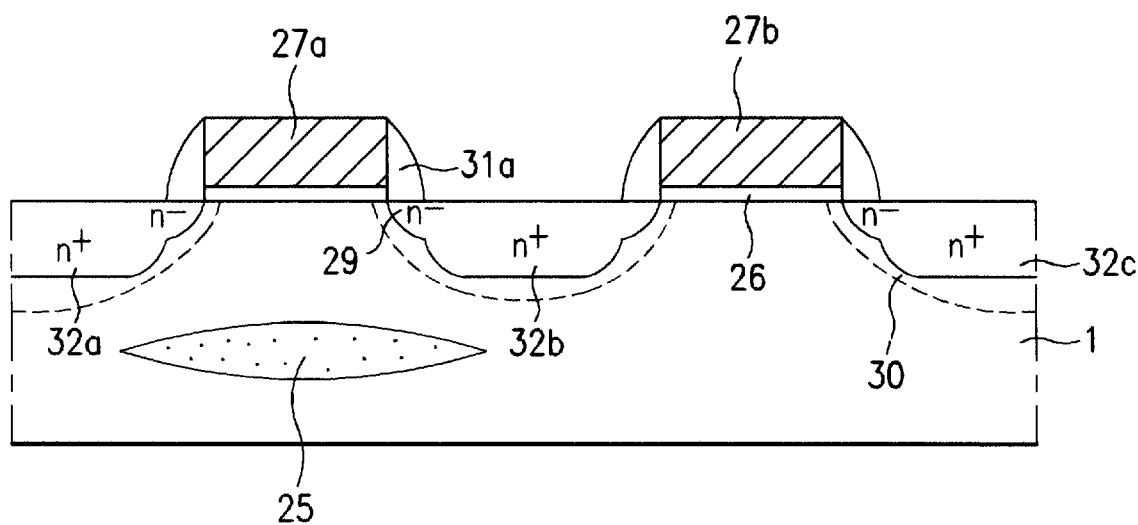
FIG. 5 is a cross-sectional view illustrating two NMOS transistors according to the present invention, connected in series in the logic circuit of the NAND gate of FIG. 1.

As shown in FIG. 5, a semiconductor device having two transistors connected in series according to the present invention includes first and second gate electrodes 27a and 27b formed on an active region of a semiconductor substrate 21 where the active region and a field region are defined at a predetermined interval. Gate insulating films 26 are formed between the semiconductor substrate 21 and the first and second gate electrodes 27a and 27b. A punch-through stop layer 25 is formed in the semiconductor substrate 21 below the first gate electrode 27a at a predetermined depth. An insulating sidewalls 31a are formed at both sides of the first and second gate electrodes 27a and 27b. First, second, and third heavily doped n-type impurity regions 32a, 32b and 32c are formed in the surface of the semiconductor substrate 21 at both sides of the first and second gate electrodes 27a and 27b. A halo regions 30 are formed below the first, second, third heavily doped n-type impurity regions 32a, 32b, and 32c.

The punch-through stop layer 25 is formed in a portion where a ground voltage terminal Vss, and a power source voltage terminal Vdd are applied therein. Vss of an NMOS transistor is connected in series in the logic circuit of the NAND gate whereas Vdd of a PMOS transistor is connected in series in the logic circuit of the NOR gate.

Meanwhile, impurities having a conductivity type opposite to the source/drain is implanted into the halo region 30 using a higher energy.

A method of fabricating two NMOS transistors connected in series in the logic circuit of the NAND gate according to the present invention will be described with reference to FIGS. 6A to 6I.

Figure 6A:
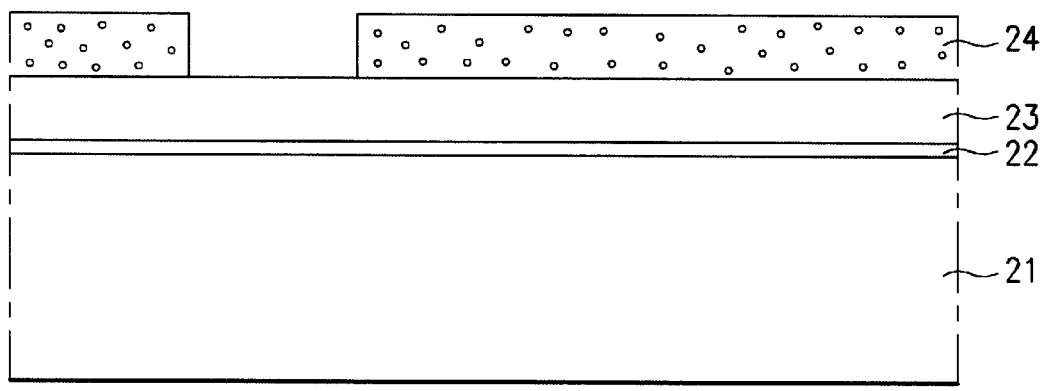
FIGS. 6A to 6I are cross-sectional views illustrating the process steps of fabricating method of two NMOS transistors according to the present invention, connected in series in the logic circuit of the NAND gate of FIG. 1.

As shown in FIG. 6A, a field oxide film (not shown) is formed at a field region of a semiconductor substrate 21 where the field region and an active region are defined. The surface of the active region of the semiconductor substrate 21 is oxidized to form a first insulating film 22 (for example, oxide) on the semiconductor substrate 21. The first insulating film 22 is formed to avoid a damage of the semiconductor substrate 21 by using a reaction gas to form a nitride film in a later process.

Similarly, a second insulating film 23 (for example, nitride) is formed on the first insulating film 22 to avoid a damage of the semiconductor substrate 21 to etch the first insulating film 22 in a later process.

A first photoresist 24 is coated on the second insulating film 23 and then patterned by exposure and developing processes to partially expose the surface of the second insulating film 23.

Figure 6B:
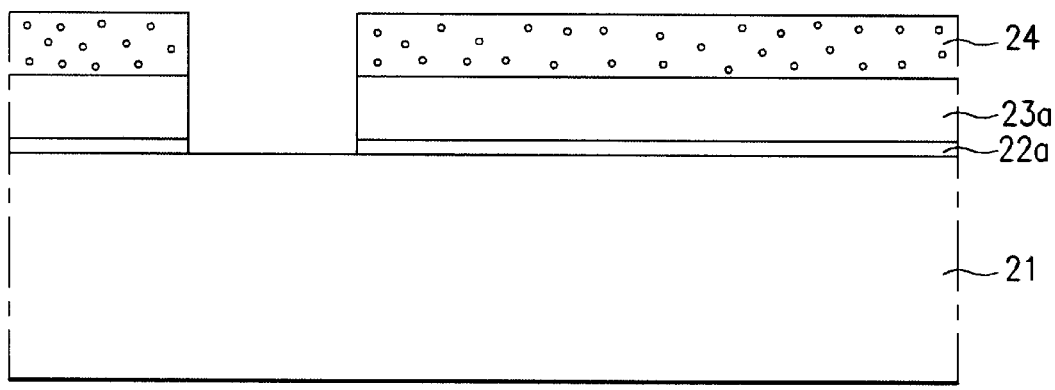

Referring to FIG. 6B, the second insulating film 23 and the first insulating film 22 are selectively removed using the patterned first photoresist 24 as a mask to form a second insulating film pattern 23a and a first insulating pattern 22a.

Figure 6C:
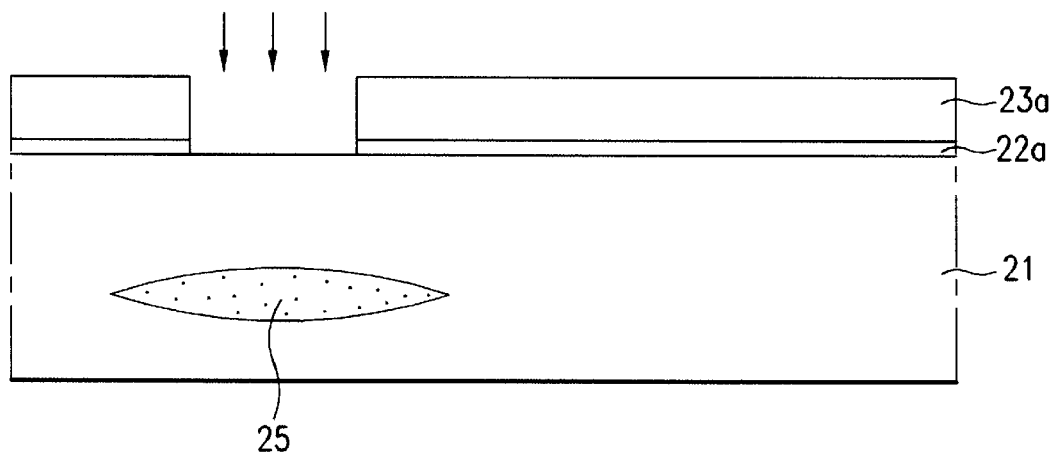

As shown in FIG. 6C, the first photoresist 24 is removed from the second insulating film pattern 23a and impurity ions for preventing a punch-through is implanted into the exposed semiconductor substrate 21 using the second insulating film pattern 23a and the first insulating film as masks to form a punch-through stop layer 25 in the exposed semiconductor substrate 21 having a predetermined depth.

In the NMOS transistor, boron is used as the impurity ions for preventing a punch-through at an energy of 20~50 KeV and a dosage of $1 \times 10^{12}$~$5 \times 10^{13}$/cm$^2$. In the PMOS transistor, phosphorus is used as the impurity ions for preventing a punch-through at an energy of 60~100 KeV and a dosage of $1 \times 10^{12}$~$5 \times 10^{13}$/cm$^2$.

Alternatively, Arsenic may be used in the PMOS transistor as the impurity ions using an energy of 140~200 KeV and a dosage of $1 \times 10^{12}$~$5 \times 10^{13}$/cm$^2$. Further, BF$_2$ or In may be used as the impurity ion in the NMOS transistor. In the PMOS transistor, Sb may be used as the impurity ion.

Figure 6D:
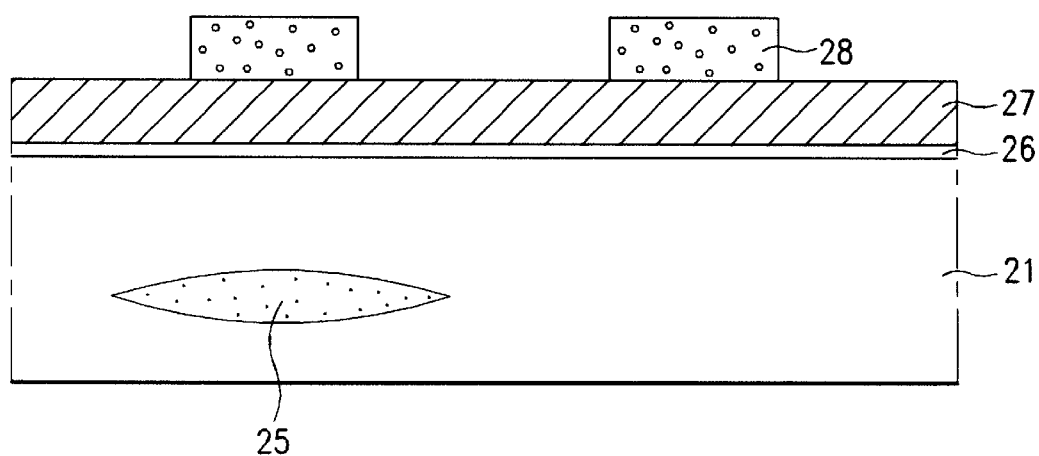

As shown in FIG. 6D, the second insulating film pattern 23a and the first insulating film pattern 22a are removed. A gate insulating film 26 and a conductive layer 27 for a gate electrode are formed on an entire surface of the semiconductor substrate 21. Subsequently, a second photoresist 28 is coated on the conductive layer 27 and then selectively patterned by exposure and developing processes to define a gate electrode region.

Figure 6E:
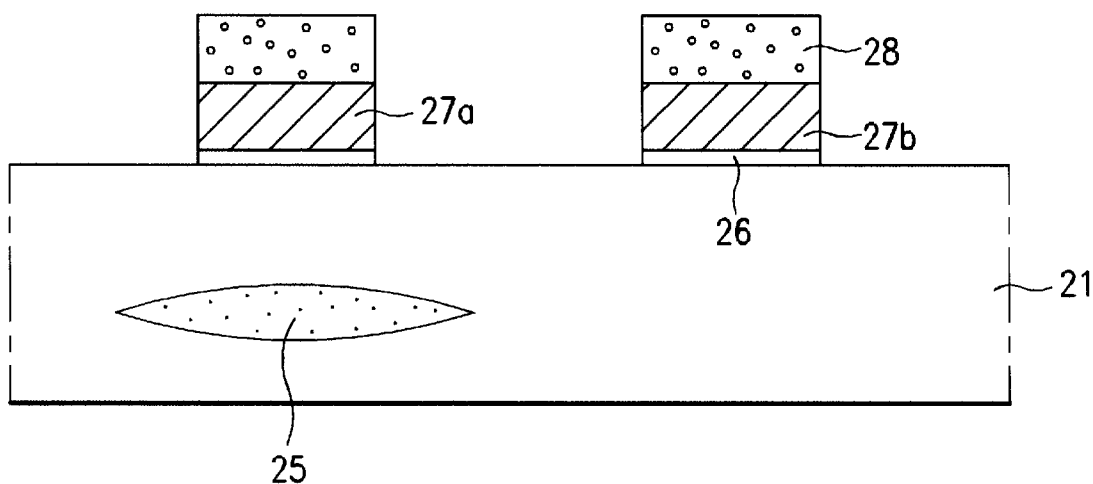

As shown in FIG. 6E, the conductive layer 27 and the gate insulating film 26 are selectively removed using the patterned photoresist 28 as a mask to form first and second gate electrodes 27a and 27b. The first gate electrode 27a is formed over the punch-through stop layer 25. The ground voltage Vss is applied to one of source/drain region while the power source voltage Vdd is applied to one of source/drain region in the PMOS transistor connected in series.

Figure 6F:
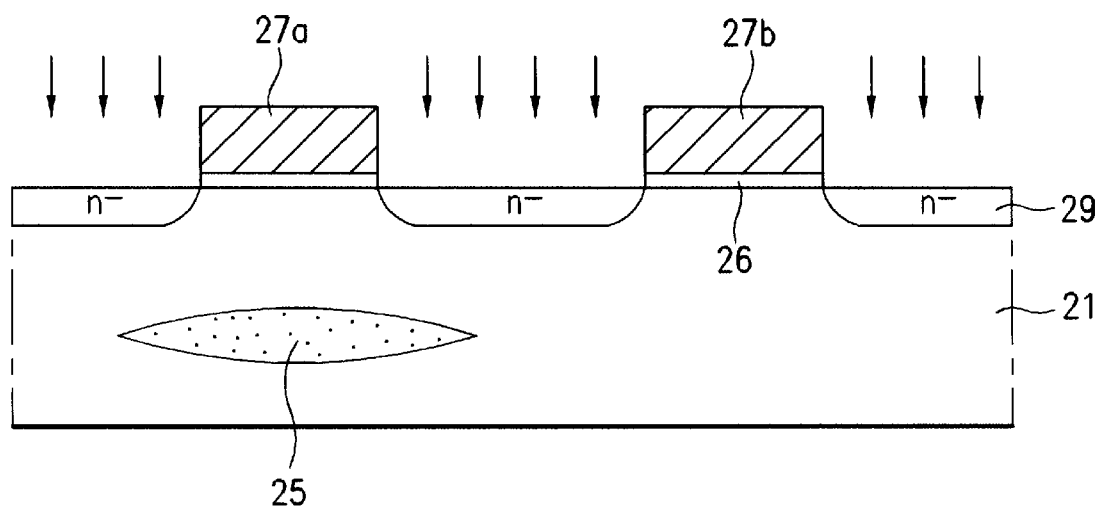

Referring to FIG. 6F, the second photoresist 28 is removed and n-type impurity ions are implanted into the entire surface of the semiconductor substrate 21 using the first and second gate electrodes 27a and 27b as masks to form an LDD region 29. The LDD 29 is formed in the surface of the semiconductor substrate 21 at both sides of the first and second gate electrodes 27a and 27b. Conversely, in the PMOS transistor, p-type impurities are implanted into the entire surface to form the LDD region 29.

Figure 6G:
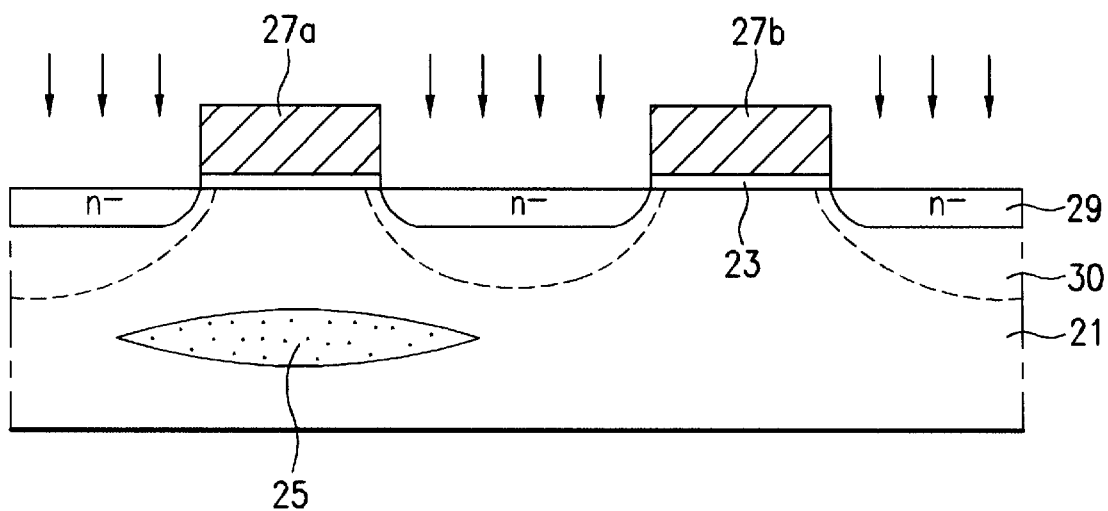

In FIG. 6G, ions are implanted into the entire surface of the semiconductor substrate 21 using the first and second gate electrodes 27a and 27b as masks to form a halo region 30 below the LDD region 29. The ions forming the halo region 30 have a conductivity type the same as the punch-through region and the opposite to the LDD region.

In the NMOS transistor, BF$_2$ ions are used as the halo ions at an energy of 100~160 KeV, a dosage of $1 \times 10^{13}$~$1 \times 10^{14}$/cm$^2$, and a tilted angle of 0~30°. In the PMOS transistor, phosphorus is used as the halo ion at an energy of 60~140 KeV, $1 \times 10^{13-14}$/cm$^2$, and a tilted angle of 0~30°. In addition, B or In may be used as the halo ion in the NMOS transistor while As or Sb may be used as the halo ion in the PMOS transistor.

Figure 6H:
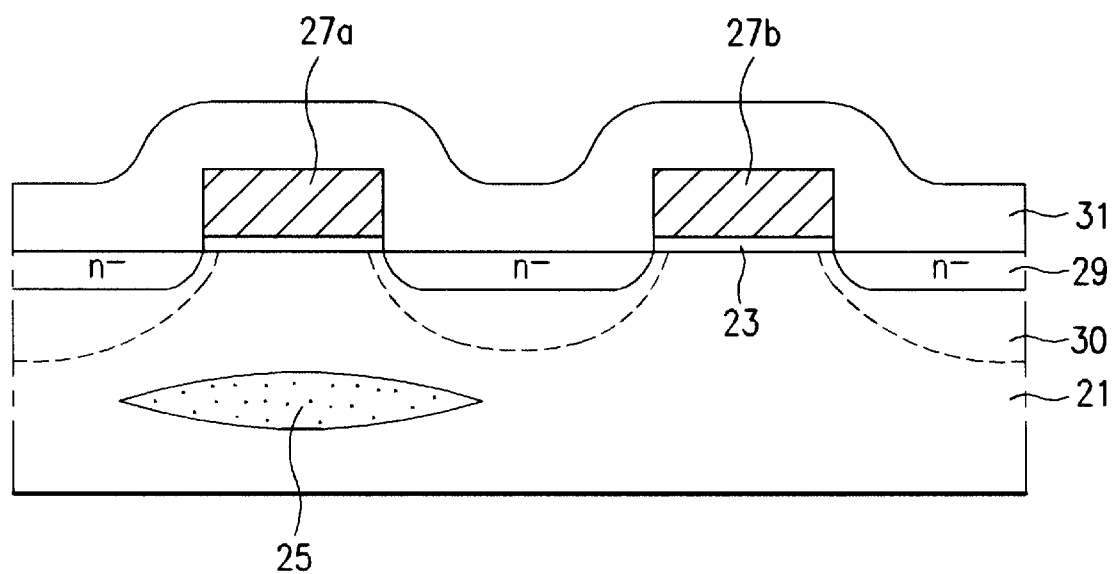

As shown in FIG. 6H, a third insulating film 31 is formed on the entire surface of the semiconductor substrate 21 including the first and second gate electrodes 27a and 27b.

Figure 6I:
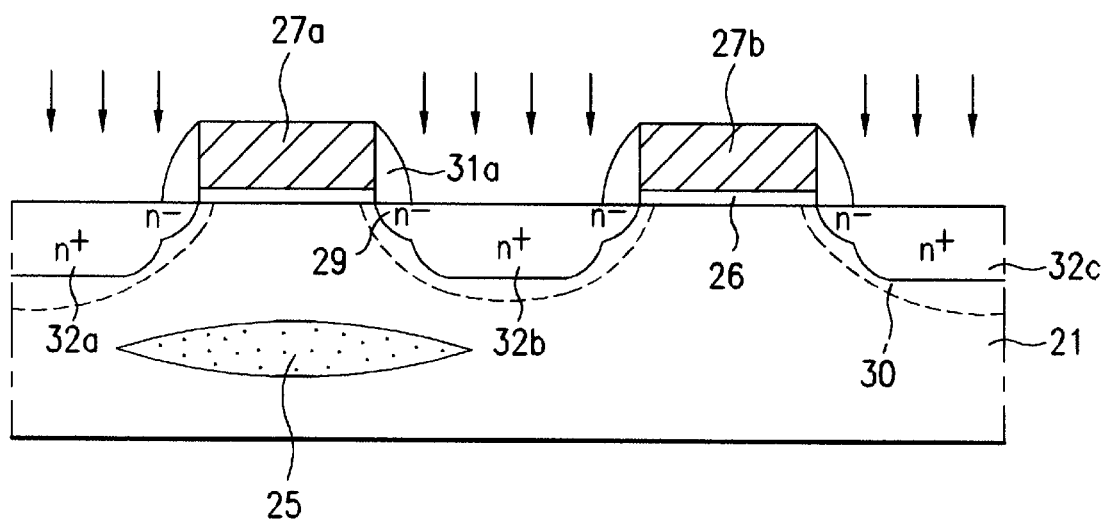

Referring to FIG. 6I, the third insulating film 31 is etched back to form an insulating film sidewalls 31a at both sides of the first and second gate electrodes 27a and 27b. Subsequently, n-type impurity ions for a source/drain is implanted into the entire surface of the semiconductor substrate 21 using the first and second gate electrodes 27a and 27b and the insulating film sidewalls 31a as masks to form first, second, and third heavily doped n-type impurity regions 32a, 32b, and 32c in the surface of the semiconductor substrate 21 at both sides of the first and second gate electrodes 27a and 27b. The first, second, and third heavily doped n-type impurity regions 32a, 32b, and 32c are connected to the LDD region 29. In the PMOS transistor, p-type impurity ions are used as the impurity ions for a source/drain.

As aforementioned, the semiconductor device and the method of fabricating the same have the following advantages.

Since the punch-through stop layer is formed only below the gate electrode of one of a plurality of transistors connected in series, a semiconductor device can be fabricated to have a threshold value the same as the neighboring transistor as well as a different gamma value.

In addition, the transistors can be operated at a high speed. This results from a low threshold voltage and a high current driving characteristic since the transistors connected in series have a different gamma value.

Further, by applying a voltage to the substrate at turn-off state, a threshold voltage of high gamma value transistors, which are connected to the ground voltage terminal Vss or the power source voltage terminal Vdd, is increased, so that a leakage current can be reduced. As a result, a power consumption is much reduced in the present invention.

It will be apparent to those skilled in the art that various modifications and variations can be made in the semiconductor device and the method for fabricating the same according to the present invention without departing from the spirit or scope of the invention. Thus, it is intended that the present invention covers the modifications and variations of the invention provided they come within the scope of the appended claims and their equivalents.

What is claimed is:

1. A method of fabricating a semiconductor device having first and second transistors connected in series in a semiconductor substrate, the method comprising the steps of:

forming an insulating film pattern on the semiconductor substrate such that a first region of the semiconductor substrate is exposed and a second region of the semiconductor substrate is covered;

forming a punch-through stop layer by implanting impurity ions in the first region of the semiconductor substrate, the second region of the semiconductor substrate being masked from the impurity ions by the insulating film pattern;

forming first and second gate electrodes respectively on the first and second regions of the semiconductor substrate, the first gate electrode located over the punch-through stop layer; and forming first, second, and third heavily doped impurity regions in the semiconductor substrate at sides of the first and second gate electrodes, wherein the first and second transistors are both one of NMOS and PMOS transistors.

2. The method according to claim 1, wherein the step of forming the punch-through stop layer comprises the steps of:

successively forming first and second insulating layers on the semiconductor substrate;

selectively removing the second insulating layer and the first insulating layer to expose a portion of the semiconductor substrate; and implanting the impurity ions into the exposed portion of semiconductor substrate to prevent a punch-through.

3. The method according to claim 2, wherein the first insulating layer is formed by oxidizing a surface of the semiconductor substrate.

4. The method according to claim 2, wherein the second insulating layer is formed of nitride.

5. The method according to claim 2, wherein the step of implanting impurity ions is executed by an implanting energy of 20~50 KeV and a dosage of $1\times10^{12}$~$5\times10^{13}$/cm$^2$ when the first and second transistors are NMOS transistors.

6. The method according to claim 5, wherein the impurity ions include boron.

7. The method according to claim 2, wherein the step of implanting impurity ions is executed by an implanting energy of 60~100 KeV and a dosage of $1\times10^{12}$~$5\times10^{13}$/cm$^2$ when the first and second transistors are PMOS transistors.

8. The method according to claim 7, wherein the impurity ions include phosphorus.

9. The method according to claim 2, wherein the step of implanting impurity ions is executed by an implanting energy of 140~200 KeV and a dosage of $1\times10^{12}$~$5\times10^{13}$/cm$^2$ when the first and second transistors are PMOS transistors.

10. The method according to claim 9, wherein the impurity ions include arsenic.

11. The method according to claim 2, wherein the impurity ions include BF2 or In when the first and second transistors are NMOS transistors and wherein the impurity ions include Sb when the first and second transistors are PMOS transistors.

12. The method according to claim 1, further comprising the step of forming third insulating layers at both sides of the first and second gate electrodes.

13. The method according to claim 1, further comprising the step of forming a lightly doped drain (LDD) region in the semiconductor substrate at both sides of the first and second gate electrodes.

14. The method according to claim 13, further comprising the step of forming a halo region in the semiconductor substrate at both sides of the first and second gate electrodes, wherein the halo region has a depth greater than the LDD region.

15. The method according to claim 14, wherein the halo region is formed by implanting $BF_2$ ions using an energy of 100~160 KeV, a dosage of $1\times10^{13}$~$1\times10^{14}$/cm$^2$ and a tilted angle of 0~30° when the transistors are NMOS transistors.

16. The method according to claim 14, wherein the halo region is formed by implanting phosphorus ions using an energy of 60~140 KeV, a dosage of $1\times10^{13}$~$1\times10^{14}$/cm$^2$, and a tilted angle of 0~30° when the first and second transistors are PMOS transistors.

17. The method according to claim 14, wherein the halo region is formed by implanting boron or indium ions when the first and second transistors are NMOS transistors.

18. The method according to claim 14, wherein the halo region is formed by implanting As or Sb when the transistors are a PMOS.

19. The method according to claim 1, wherein the first and second transistors have the same threshold value and a different gamma value.

* * * * *